United States Patent [19]

Okinoshima et al.

[11] Patent Number: 5,109,058
[45] Date of Patent: Apr. 28, 1992

[54] CURABLE RESIN SOLUTION COMPOSITIONS, THEIR PREPARATION, AND ELECTRONIC PART PROTECTIVE COATINGS

[75] Inventors: Hiroshige Okinoshima, Annaka; Hideto Kato, Takasaki, both of Japan

[73] Assignee: Shin-Etsu Chemical Co., Ltd., Tokyo, Japan

[21] Appl. No.: 739,449

[22] Filed: Aug. 2, 1991

[30] Foreign Application Priority Data

Aug. 6, 1990 [JP] Japan .................................. 2-208836

[51] Int. Cl.$^5$ .............................................. C08K 5/09
[52] U.S. Cl. ..................................... 524/588; 524/600; 528/179; 528/351
[58] Field of Search ................ 524/588, 600; 528/179, 528/351

[56] References Cited

U.S. PATENT DOCUMENTS

| 3,553,282 | 1/1971 | Holub | 524/600 |
| 4,748,228 | 5/1988 | Shoji et al. | 528/351 |
| 4,837,299 | 6/1989 | Peters et al. | 528/351 |

Primary Examiner—Paul R. Michl
Assistant Examiner—LaVonda R. DeWitt
Attorney, Agent, or Firm—Birch, Stewart, Kolasch & Birch

[57] ABSTRACT

A solution composition of a polyimide resin type curable resin having imide and alkoxysilyl groups is prepared by reacting a polyimide with a silicon compound in an organic solvent. The solution can be cured through relatively mild heating into coatings having enhanced substrate adherence and solvent resistance and thus suitable as protective coatings on electronic parts.

4 Claims, No Drawings

CURABLE RESIN SOLUTION COMPOSITIONS, THEIR PREPARATION, AND ELECTRONIC PART PROTECTIVE COATINGS

This invention relates to curable resin solution compositions of the polyimide resin type suitable for use in forming insulating protective coatings on electronic parts, method for preparing the compositions and electronic part protective coatings obtained by curing the compositions.

BACKGROUND OF THE INVENTION

Polyimide resins having improved electrical and mechanical properties have been utilized as insulating protective coatings for electronic parts. Since most polyimide resins are insoluble in organic solvents, polyimide protective coatings are generally prepared by using a polyamic acid solution which is a polyimide precursor, and applying the solution to substrates, followed by heat curing. This conventional approach, however, has several problems that the polyamic acid solution is rather difficult to apply because of its high viscosity, heat curing requires high temperatures in excess of 300° C., and the resulting polyimide coatings show poor adherence to such substrates as nickel, aluminum, silicon, and silicon oxide films. A number of solutions to these problems have been proposed.

For improving the adherence to substrates, Japanese Patent Publication Nos. 27439/1968 and 7213/1984 propose polyimide-siloxane copolymers in which a diamine component, which is a reactant for forming polyimide, is partially replaced by a siloxane-containing diamine. Also, Japanese Patent Publication Nos. 32162/1983, 32163/1983, 266436/1986, 207438/1986, and 29510/1989 disclose a method for mixing or reacting a polyamic acid or polyimide precursor with a silane having an amino group or acid anhydride group. However, the former method had the problem that copolymers with an increased content of siloxane showed poor heat resistance. In the latter method, the polyamic acid solution experienced a substantial loss of shelf stability with an increasing amount of silane added.

In order to avoid the heat treatment at as high temperatures as beyond 300° C. which is necessary in curing polyamic acid into polyimide films, it was proposed to form films directly from a polyimide resin by dissolving a polyimide resin having a siloxane bond itself in a suitable solvent (see Japanese Patent Publication Nos. 83228/1986, 118424/1986, and 118425/1986) or by using an imide resin having an alkoxysilyl group (see Japanese Patent Publication Nos. 35076/1980 and 35077/1980). Both the methods left unacceptable problems in practical applications. Polyimide resin films resulting from the former method had poor solvent resistance by nature. The latter method required to add water for hydrolysis of alkoxysilane, but storage stability after hydrolysis was poor.

SUMMARY OF THE INVENTION

An object of the present invention is to provide a new and improved curable resin solution composition of the polyimide resin type which is less viscous, easy to apply, and shelf stable, and can cure at relatively low temperatures to films having improved heat resistance, mechanical strength, electrical properties, solvent resistance, and substrate adherence.

Another object of the invention is to provide a method for preparing the improved curable resin solution composition.

A further object of the invention is to provide a protective coating for electronic parts by curing the composition.

The inventors have succeeded in producing a novel polyimide resin type curable resin containing imide and alkoxysilyl groups represented by the following structural formula (I):

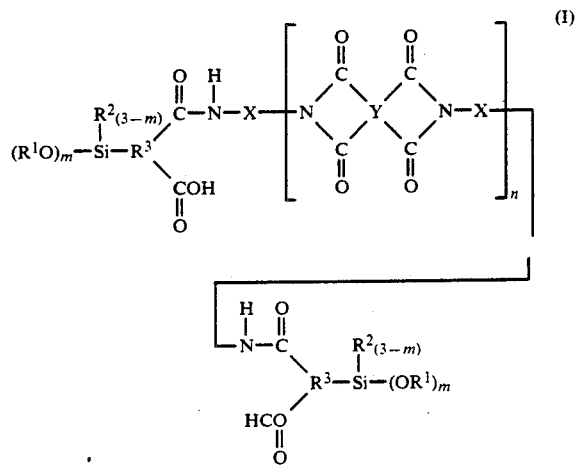

wherein $R^1$ and $R^2$ are independently selected from monovalent substituted or unsubstituted hydrocarbon groups having 1 to 10 carbon atoms, $R^3$ is a trivalent organic group containing an aliphatic or aromatic ring, X is a divalent organic group, Y is a tetravalent organic group containing an aromatic ring, letter m is an integer of from 1 to 3, and n is an integer of at least 1, by reacting a polyimide of the following structural formula (II):

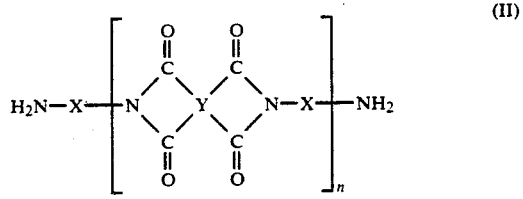

wherein X, Y and n is an defined above with a silicon compound of the following structural formula (III):

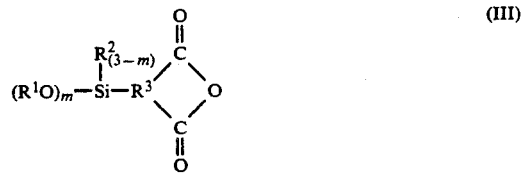

wherein $R^1$, $R^2$, $R^3$ and m are as defined above in an organic solvent. The resin is available in solution or varnish form, that is as a solution composition of the polyimide resin type curable resin in the organic solvent. The solution composition is relatively low in viscosity and thus easy to apply or coat. The solution composition is also shelf stable and after coating, can be readily cured into films by heating at relatively low temperatures below 300° C. The cured coatings firmly adhere to the underlying substrates, and they possess not only improved heat resistance, mechanical strength, and electrical properties, but also solvent resistance so that they are useful as protective coatings for electronic parts.

Therefore, according to the present invention, there is provided a curable resin solution composition of a curable resin having formula (I) in an organic solvent. Also provided is a method for preparing a curable resin solution composition by reacting a polyimide of formula (II) with a silicon compound of formula (III) in an organic solvent. The invention further provides a protective coating for electronic parts, obtained by curing resin.

DESCRIPTION OF THE PREFERRED EMBODIMENTS

The curable resin solution composition of the present invention is comprised of a polyimide resin type curable resin represented by structural formula (I) in an organic solvent. (I):

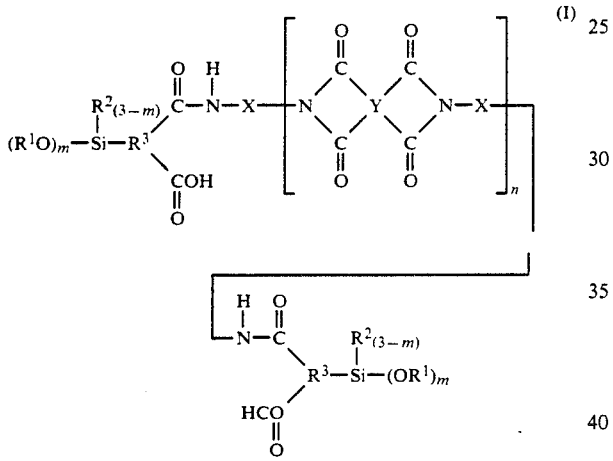

In formula (I),
  $R^1$ and $R^2$, which may be the same or different, are monovalent substituted or unsubstituted hydrocarbon groups having 1 to 10 carbon atoms,
  $R^3$ is a trivalent organic group containing an aliphatic or aromatic ring,
  X is a divalent organic group,
  Y is a tetravalent organic group containing an aromatic ring,
  letter m is an integer of from 1 to 3, and n is an integer of at least 1, preferably 1 to 100 for ease of application and increased adherence.

The curable resin (I) can be formed by reacting a polyimide of structural formula (II):

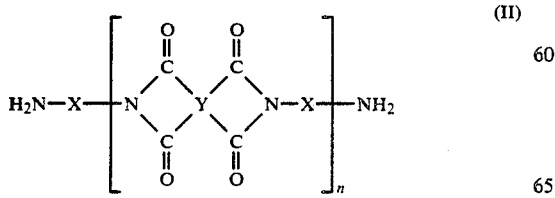

wherein X, Y and n are as defined above with a silicon compound of structural formula (III):

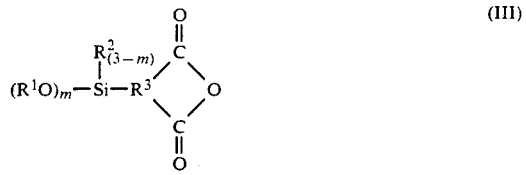

wherein $R^1$, $R^2$, $R^3$ and m are as defined above in an organic solvent.

The polyimide of formula (II) can be prepared by reacting a tetracarboxylic dianhydride of the following structural formula (IV):

wherein Y is as defined above with a diamine of the following structural formula (V):

$$H_2N-X-NH_2 \quad (V)$$

wherein X is as defined above in such a proportion that (n+1) molecules of the diamine of formula (V) are available per n molecules of the tetracarboxylic dianhydride of formula (IV) wherein n is an integer of at least 1, the thereby forming a polyamic acid of the following structural formula (VI), followed by dehydration in a conventional manner (generally by heating at 120° to 200° C. for 2 to 24 hours). The reaction scheme is shown below.

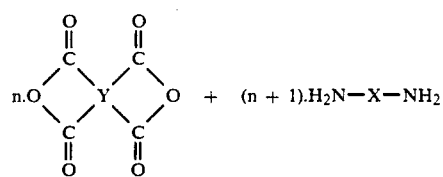

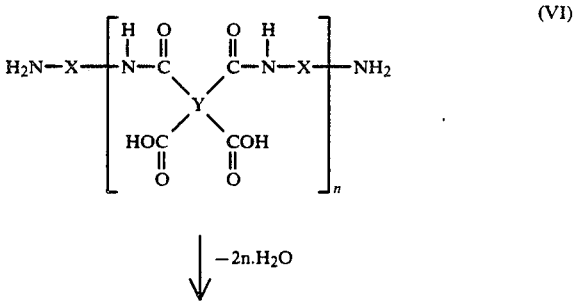

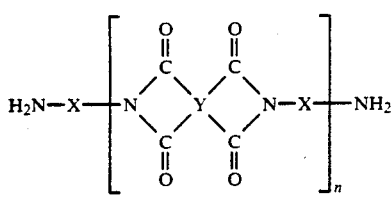

In the foregoing formulae, Y is a tetravalent organic group having an aromatic ring, which originates from the tetracarboxylic dianhydride of formula (IV) which is used as a starting reactant to form the polyimide of formula (II).

The acid dianhydride of formula (IV) is often selected from, but not limited to, pyromellitic dianhydride where Y is

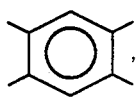

benzophenonetetracarboxylic dianhydride where Y is

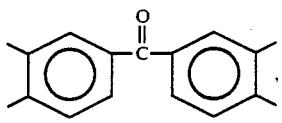

3,3',4,4'-biphenyltetracarboxylic dianhydride where Y is

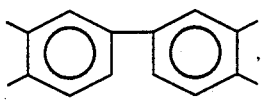

2,2-bis(3,4-benzenedicarboxylic anhydride)-perfluoropropane where Y is

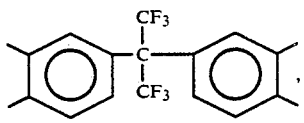

bis(3,4-dicarboxyphenyl)dimethylsilane dianhydride where Y is

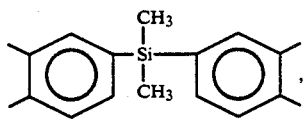

and 1,3-bis(3,4-dicarboxyphenyl)-1,1,3,3,-tetramethyldisiloxane dianhydride where Y is

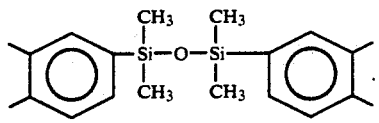

Y may be one or a mixture of the foregoing members. Therefore, when a tetracarboxylic dianhydride of formula (IV) is reacted with a diamine of formula (V) to form a polyamide of formula (II), either a single dianhydride or a mixture of two or more dianhydrides may be used.

In the foregoing formulae, X is a divalent organic group, which originates from the diamine of formula (V) which is used as a starting reactant to form the polyimide of formula (II). Illustrative, non-limiting examples of the diamine of formula (V) include aromatic ring-containing diamines having 6 to 20 carbon atoms and silicon diamines.

Aromatic ring containing diamines include
p-phenylenediamine,
m-phenylenediamine,
4,4'-diaminodiphenylmethane,
4,4'-diaminodiphenyl ether,
2,2'-bis(4-aminophenyl)propane,
4,4'-diaminodiphenyl sulfone,
4,4'-diaminodiphenyl sulfide,
1,4-bis(3-aminophenoxy)benzene,
1,4-bis(4-aminophenoxy)benzene,
1,4-bis(m-aminophenylsulfonyl)benzene,
1,4-bis(p-aminophenylsulfonyl)benzene,
1,4-bis(m-aminophenylthioether)benzene,
1,4-bis(p-aminophenylthioether)benzene,
2,2-bis[4-(4-aminophenoxy)phenyl]propane,
2,2-bis[3-(methyl-4-(4-aminophenoxy)phenyl]propane,
2,2-bis[3-chloro-4-(4-aminophenoxy)phenyl]propane,
1,1-bis[4-(4-aminophenoxy)phenyl]ethane,
1,1-bis[3-methyl-4-(4-aminophenoxy)phenyl]ethane,
1,1-bis[3-chloro-4-(4-aminophenoxy)phenyl]ethane,
1,1-bis[3,5-dimethyl-4-(4-aminophenoxy)phenyl]ethane,
bis[4-(4-aminophenoxy)phenyl]methane,
bis[3-methyl-4-(4-aminophenoxy)phenyl]methane,
bis[3-chloro-4-(4-aminophenoxy)phenyl]methane,
bis[3,5-dimethyl-4-(4-aminophenoxy)phenyl]methane,
bis[4-(4-aminophenoxy)phenyl]sulfone,
2,2-bis[4-(4-aminophenoxy)phenyl]perfluoropropane,
etc.

The silicon diamines may have the following formula.

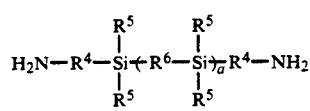

wherein $R^4$ represents $-(CH_2)_b-$,

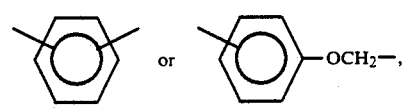

$R^5$ representes an alkyl group having 1 to 10 carbon atoms or an arly group having 6 to 10 carbon atoms, $R^6$ represents $-O-$, $-(CH_2)_c-$ or

$a$ is an integer of 1 to 100, $b$ is 1 to 10 and $c$ is 1 or 2.

The silicon diamines include

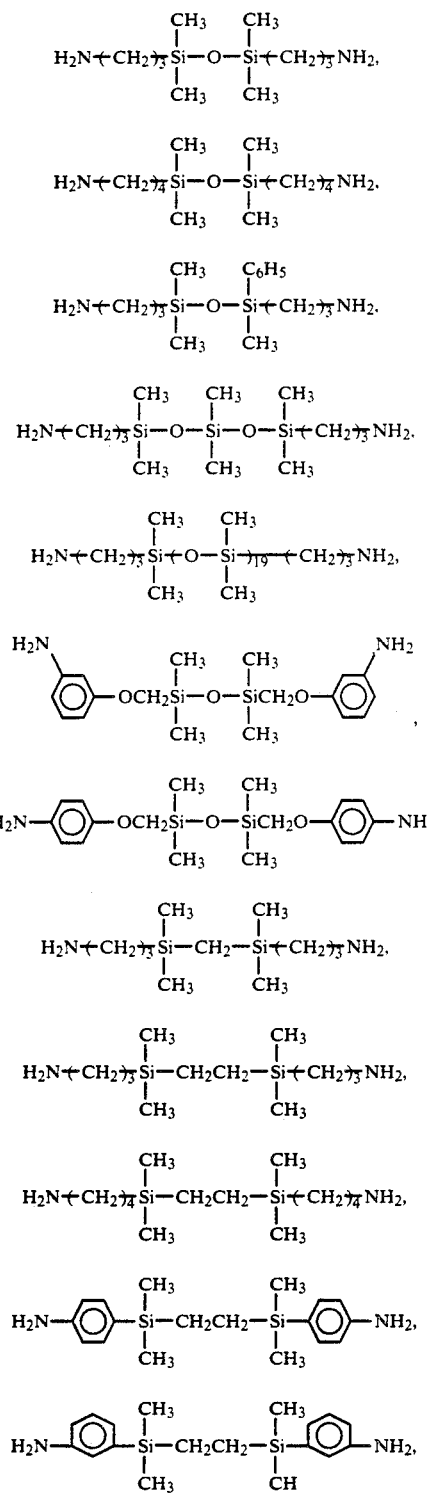

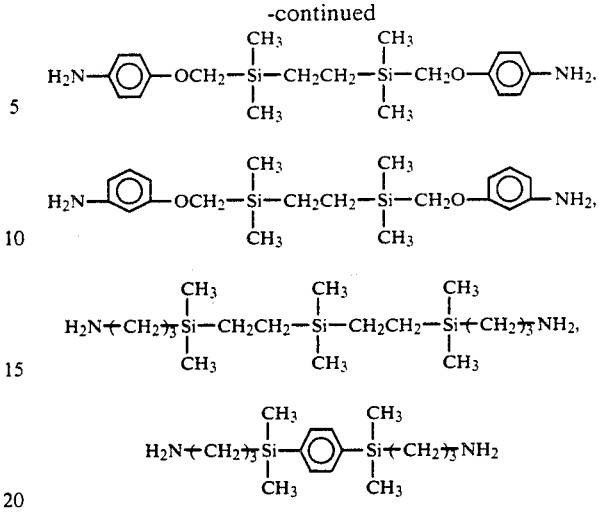

X may be one or a mixture of the foregoing diamine residues. Therefore, either a single diamine or a mixture of two or more diamines may be used in producing the polyimide of formula (II).

The silicon compound used herein is of the following structural formula (III).

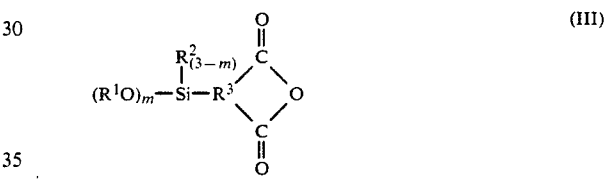

In formula (III), $R^1$ and $R^2$, which may be the same or different, are substituted or unsubstituted monovalent hydrocarbon group having 1 to 10 carbon atoms, preferably 1 to 6 carbon atoms, for example, alkyl groups such as methyl, ethyl, propyl and butyl groups; alkenyl groups such as vinyl, allyl and butenyl groups; aryl groups such as phenyl and tolyl groups; and substituted ones of these groups wherein some or all of the hydrogen atoms attached to carbon atoms are replaced by halogen atoms, cyano groups, and alkoxy group, for example, chloromethyl, chloropropyl, 3,3,3-trifuloro-propyl, 2-cyanoethyl, methoxyethyl, and ethoxyethyl groups. Among these, alkyl groups and alkoxy-substituted alkyl groups are preferred for $R^1$ and substituted or unsubstituted alkyl and aryl groups are preferred for $R^2$.

$R^3$ is a trivalent organic group containing an aliphatic or aromatic ring, more specifically a trivalent substituted or unsubstituted hydrocarbon group containing an aliphatic or aromatic ring, for example, trivalent aliphatic rings such as

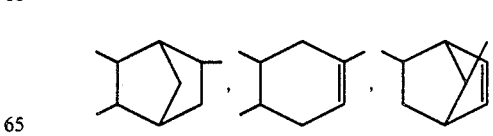

and trivalent aromatic rings having 6 to 20 carbon atoms such as

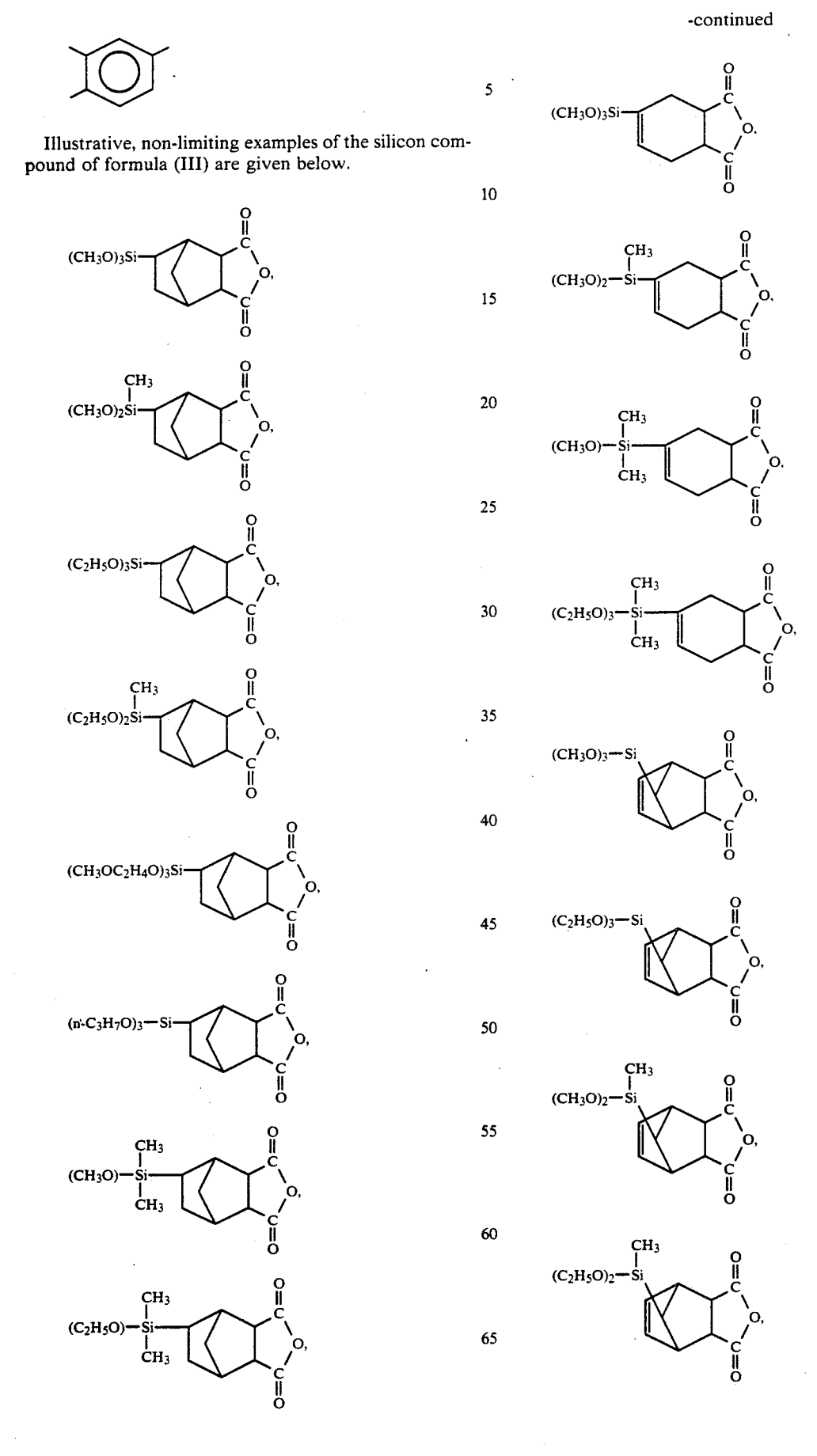

Illustrative, non-limiting examples of the silicon compound of formula (III) are given below.

-continued

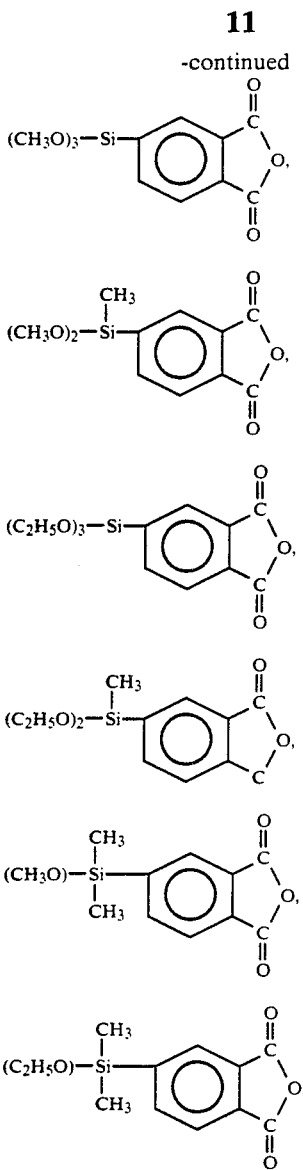

In the practice of the invention, the silicon compounds may be used alone or in admixture of two or more.

The curable resin of formula (I) is prepared by reacting a polyimide of formula (II) with a silicon compound of formula (III) both as defined above in an organic solvent. There is obtained a curable resin solution composition having the curable resin of formula (I) dissolved in the organic solvent according to the present invention.

Examples of the solvent include ethers such as tetrahydrofuran, 1,4-dioxane, diglyme (diethylene glycol dimethyl ether), and diethylene glycol diethyl ether; cellosolves such as methyl cellosolve, ethyl cellosolve, and butyl cellosolve; ketones such as acetone, methyl ethyl ketone, methyl isobutyl ketone, cyclopentanone, and cyclohexanone, and esters such as γ-butyrolactone, butylcellosolve acetate, butyl acetate, and ethyl acetate, alone and in admixture of two or more. The amount of the solvent used is not particularly limited. Preferably the solvent is used in amounts to provide a solid concentration of 1 to 60% by weight, more preferably 5 to 40% by weight of the reaction system so that the resulting reaction product is ready for use as a curable resin solution composition.

On reaction, the silicon compound of formula (III) and the polyimide of formula (II) are preferably used in a molar ration, (III)/(II), of from about 1.9 to about 2.1 while the reaction temperature preferably ranges from $-20°$ C. to 70° C., especially from 0° C. to 50° C. The reaction time is generally in the range of from about ½ to about 10 hours.

The curable resin solution composition of the present invention preferably has a solid concentration of 1 to 60%, more preferably 5 to 40% by weight of the composition. The solvent is the same as previously mentioned as the reaction medium. The curable resin solution composition is easy to handle and apply since it is shelf stable and relatively low in viscosity. Cured films are generally obtained from the solution composition by heating at a temperature of 100° to 350° C., more preferably 150° to 300° C. for about 1 to about 10 hours, whereby the amic acid moiety in structural formula (I) is imidized with attendant formation of water which, in turn, promotes crosslinking reaction of alkoxysilyl groups. As a result, the resin cures into a high molecular weight polymer having an imide ring which exhibits improved heat resistance, mechanical properties, electrical properties, adherence to substrates, and solvent resistance.

The curable resin solution compositions of the invention will find a wide variety of applications as coatings or films on various substrates, typically semiconductor devices, for example, passivation films and protective films on semiconductor element surface, junction protective films over junctions of diodes and transistors, alpha-radiation shielding films on VLSI, interlayer insulating films, ion implantation masks, conformal coatings on printed circuit boards, orienting films of liquid crystal display elements, glass fiber protective films, and solar battery surface protective films.

There have been described curable resin solution compositions that are relatively less viscous and shelf stable and that can be cured onto substrates at relative low temperatures of below 300° C. to form coatings having excellent heat resistance, mechanical strenght, electrical properties, solvent resistance, and adherence. The method of the invention enables easy and efficient preparation of the curable resin solution compositions.

EXAMPLE

Examples of the present invention are given below by way of illustration and not by way of limitation.

EXAMPLE 1

A flask equipped with a stirrer, thermometer, and nitrogen purge line was charged with 8.0 grams (0.04 mol) of diaminodiphenyl ether as a diamine component and 230 grams of cyclohexanone as a solvent. To the flask was gradually added 13.3 grams (0.03 mol) of 2,2-bis(3,4-benzenedicarboxylic anhydride)perfluoropropane as a tetracarboxylic dianhydride component. At the end of addition, the reaction solution was stirred for 10 hours at room temperature. Then the flask was connected to a reflux condenser having a water collecting container, 30 grams of toluene added to the flask, and the reaction system heated to 140° C. and maintained at the temperature for 10 hours. There was collected 1.1 grams of water.

The above procedure yielded a cyclohexanone solution of a polyimide having the following structural formula.

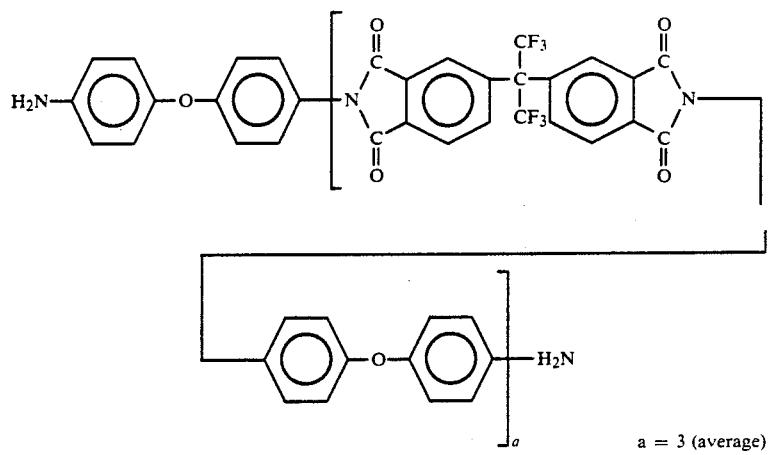

a = 3 (average)

To the solution was added 5.7 grams (0.02 mol) of 5-(trimethoxysilyl)norbornyl-2,3-dicarboxylic anhydride. Stirring was continued at room temperature for 4 hours. There was obtained a 10% cyclohexanone solution of an end curable resin of the following structural formula.

propane as a diamine component, 8.9 grams (0.02 mol) of 2,2-bis(3,4-benzenedicarboxylic anhydride)perfluoropropane and 8.5 grams (0.02 mol) of 1,3-bis(3,4-diocarboxyphenyl)1,1-3,3-tetramethyldisiloxane dianhydride as a tetracarboxylic dianhydride component, 5.4 grams (0.02 mol) of 5-(dimethoxymethylsilyl)norbornyl-2,3-dicarboxylic anhydride as a silicon compound, and 315 grams of diglyme as a solvent.

There was obtained a 25% diglyme solution of an end curable resin of the following structural formula.

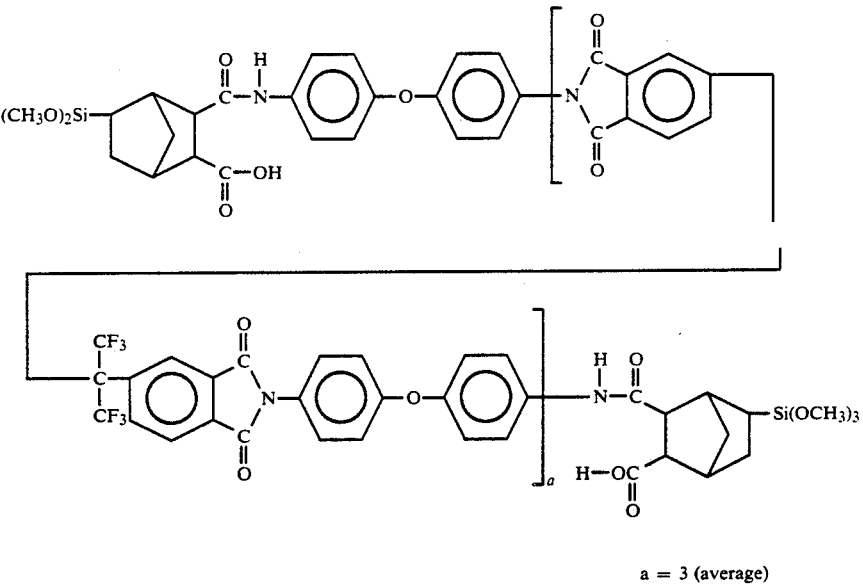

a = 3 (average)

EXAMPLE 2

The procedure of Example 1 was repeated using 20.5 grams (0.05 mol) of 2,2-bis[4-(4-aminophenoxy)phenyl]-

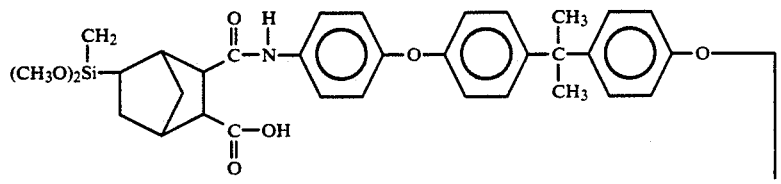

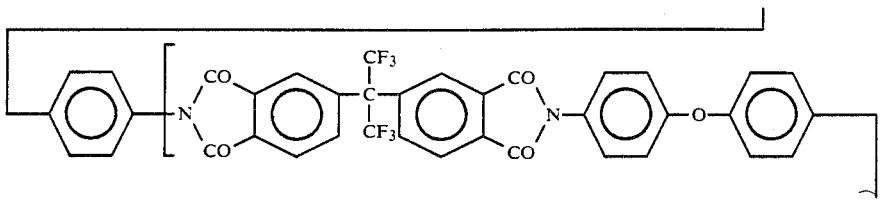

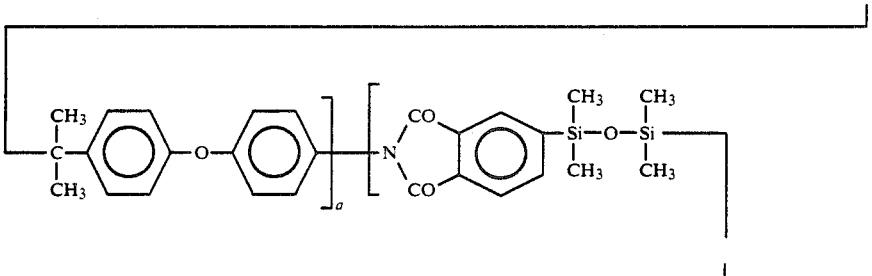

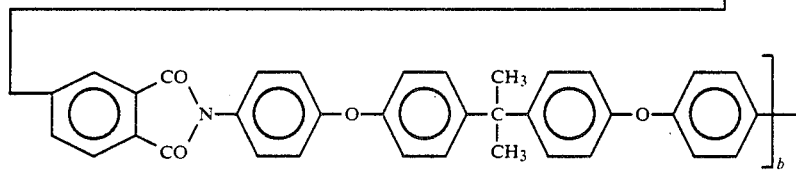

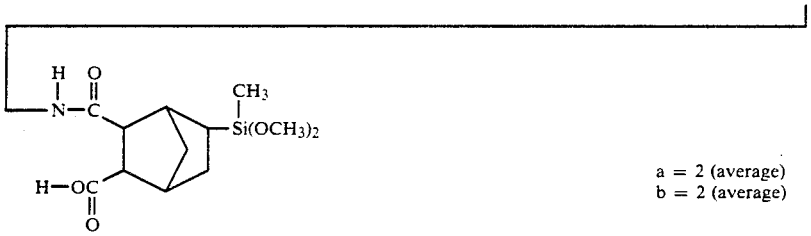

a = 2 (average)
b = 2 (average)

EXAMPLE 3

The procedure of Example 1 was repeated except that the diamine component was a mixture of 12.3 grams (0.03 mol) of 2,2-bis[4-(4-aminophenoxy)phenyl]propane and 5.0 grams (0.02 mol) of 1,3-bis(γ-aminopropyl)-1,1,3,3-tetramethyldisiloxane, the tetracarboxylic dianhydride component was a mixture of 8.9 grams (0.02 mol) of 2,2-bis(3,4-benzenedicarboxylic anhydride)perfluoropropane and 5.9 grams (0.02 mol) of 3,3'-4,4'-biphenyltetracarboxylic dianhydride, the silicon compound was 5.7 grams (0.02 mol) of 5-(trimethoxysilyl)norbornyl-2,3-dicarboxylic anhydride, and the solvent was 330 grams of γ-butyrolactone. There was obtained a 10% γ-butyrolactone solution of an end curable resin of the following structural formula.

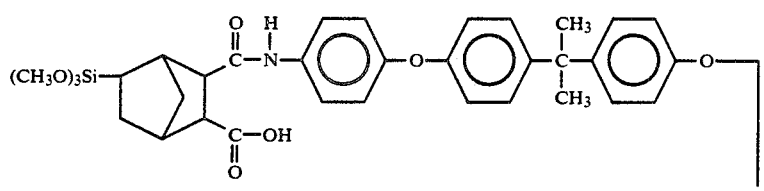

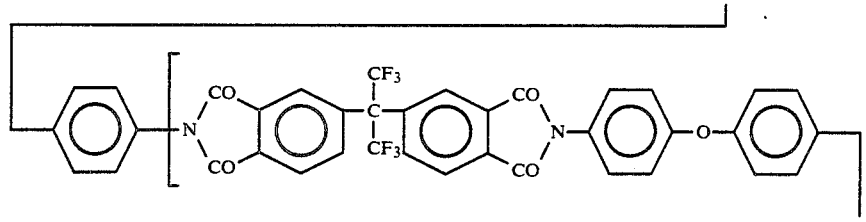

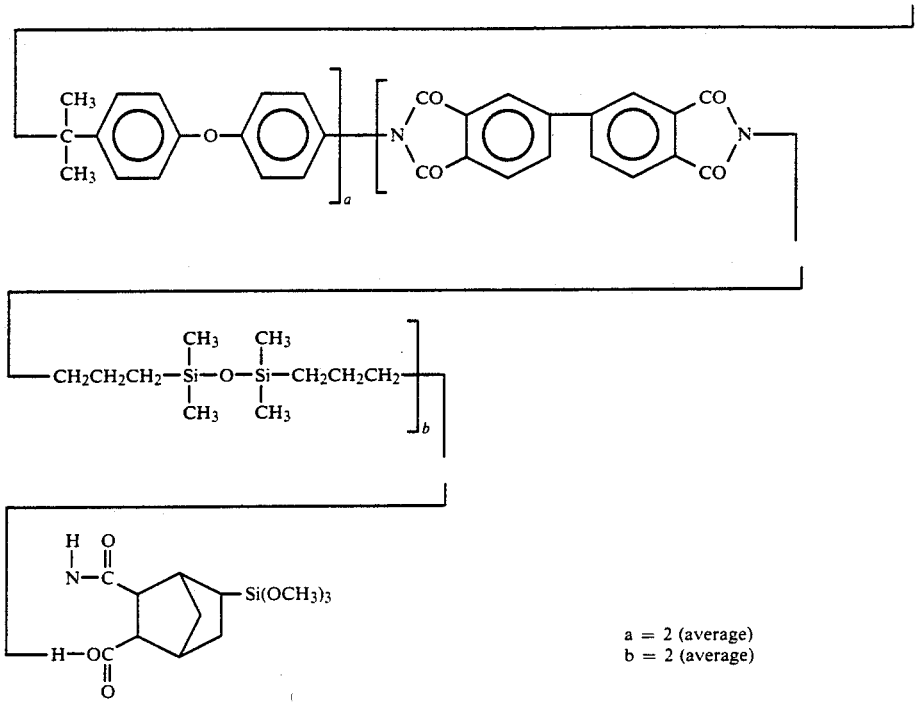

a = 2 (average)
b = 2 (average)

EXAMPLE 4

The procedure of Example 1 was repeated except that the diamine component was 20.7 grams (0.04 mol) of 2,2-bis[4-(4-aminophenoxy)phenyl]perfluoropropane, the tetracarboxylic dianhydride component was 13.3 grams (0.03 mol) of 2,2-bis(3,4-benzenedicarboxylic anhydride)perfluoropropane, the silicon compound was 5.4 grams (0.02 mol) of 4-trimethoxysilyl-1,2,3,6-tetrahydrophthalic anhydride, and the solvent was 350 grams of diglyme. There was obtained a 10% diglyme solution of an end curable resin of the following structural formula.

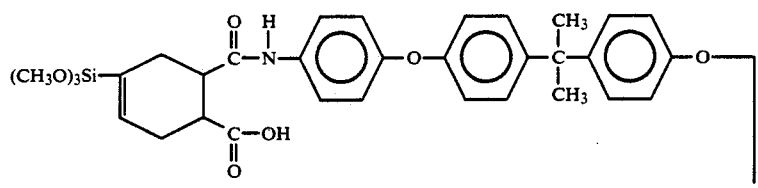

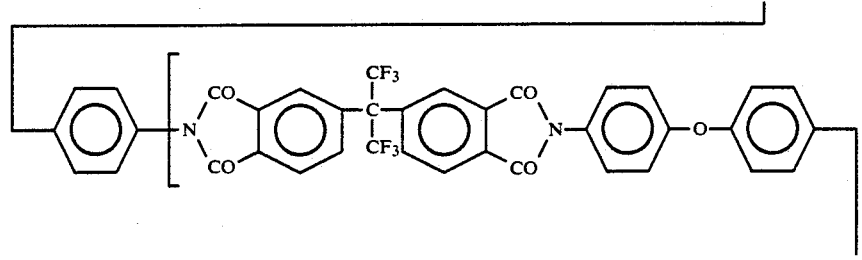

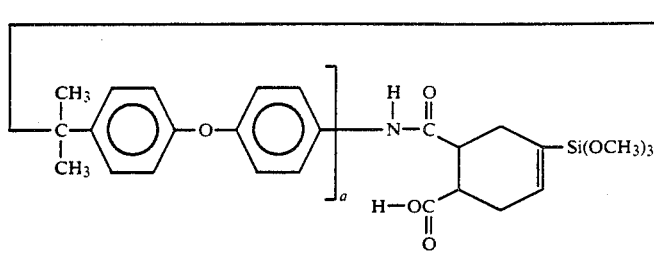

a = 3 (average)

COMPARATIVE EXAMPLE 1

A polyamic acid solution containing an alkoxysilane compound was prepared by reacting 17.8 grams (0.04 mol) of 2,2-bis(3,4-benzenedicarboxylic anhydride)perfluoropropane and 16.4 grams (0.04 mol) of 2,2-bis[4-(4-aminophenoxy)phenyl]propane in 310 grams of diglyme to form a polyamic acid solution, and adding 2.9 grams (0.01 mol) of 5-(trimethoxysilyl)norbornyl-2,3-dicarboxylic anhydride to the solution.

COMPARATIVE EXAMPLE 2

A diglyme solution of a polyimide resin was prepared by reacting 17.8 grams (0.04 mol) of 2,2-bis(3,4-benzenedicarboxylic anhydride)perfluoropropane and 12.3 grams (0.03 mol) of 2,2-bis[4-(4-aminophenoxy)phenyl]propane and 2.5 grams (0.01 mol) of 1,3-bis(γ-aminopropyl)-1,1,3,3-tetramethyldisiloxane in 280 grams of diglyme to form a polyamic acid solution, and heating the solution at 150° C. for 6 hours while removing water.

The curable resin solution compositions obtained in Examples 1-4 and the solutions obtained in Comparative Examples 1-2 were examined for viscosity at 25° C. and shelf stability by shelf storing at 5° C. for 3 months. Also, the solutions were applied to SiO₂ substrates, cured at 150° C. for one hour and post cured at 200° C. for one hour. The resulting resin coatings were examined for adherence to the substrates and resistance against diglyme.

The results are shown in Table 1.

TABLE 1

| | | Solvent | Non-volatile content, % | Viscosity, centistokes | Stability after 3-month storage | Cured coating Adherence to SiO₂ | Cured coating Solvent resistance |
|---|---|---|---|---|---|---|---|
| Example | 1 | cyclohexanone | 10 | 4 | Good | Good | Good |
| | 2 | diglyme | 25 | 80 | Good | Good | Good |
| | 3 | γ-butyrolactone | 10 | 5 | Good | Good | Good |
| | 4 | diglyme | 10 | 3 | Good | Good | Good |
| Comparative Example | 1 | diglyme | 10 | 120 | Gel | Good | Good |
| | 2 | diglyme | 10 | 35 | Good | Good | Dissolved |

As is evident from Table 1, the resin solution compositions of Examples 1-4 have a low viscosity and high shelf stability and are cured through relatively mild heating at about 200° C. into coatings which firmly adhere to the underlying substrates and are chemically resistant against organic solvents.

Although some preferred embodiments have been described, many modifications and variations may be made thereto in the light of the above teachings. It is therefore to be understood that within the scope of the appended claims, the invention may be practiced otherwise than as specifically described.

We claim:

1. A curable resin composition comprising, in solution form, a curable resin of the following structural formula:

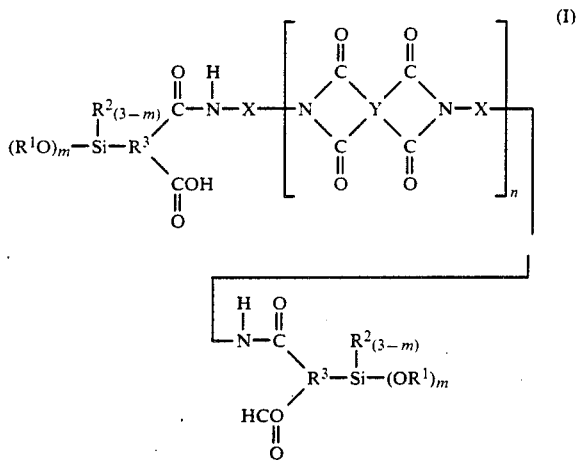

(I)

wherein $R^1$ and $R^2$ are independently selected from monovalent substituted or unsubstituted hydrocarbon groups having 1 to 10 carbon atoms, $R^3$ is a trivalent organic group containing an aliphatic or aromatic ring, X is a divalent organic group, Y is a tetravalent organic group containing an aromatic ring, letter m is an integer of from 1 to 3, and n is an integer of at least 1, and an organic solvent.

2. A method for preparing a curable resin solution composition as set forth in claim 1, comprising the step of:

reacting a polyimide of the following structural formula:

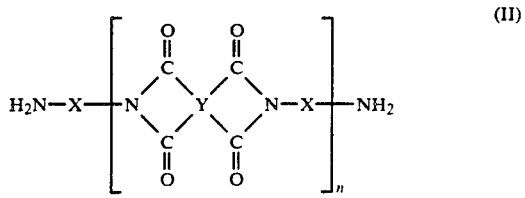

(II)

wherein X is a divalent organic group, Y is a tetravalent organic group containing an aromatic ring, and letter n is an integer of at least 1, with a silicon compound of the following structural formula:

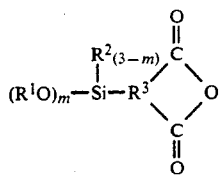 (III)

wherein $R^1$ and $R^2$ are independently selected from monovalent substituted or unsubstituted hydrocarbon groups having 1 to 10 carbon atoms, $R^3$ is a trivalent organic group containing an aliphatic or aromatic ring, letter m is an integer of from 1 to 3, in an organic solvent.

3. The method of claim 2 wherein the amount of the solvent used in a reaction system is to provide a solid concentration of 1 to 60% by weight of the reaction system.

4. An electronic part protective coating obtained by coating and curing a curable resin solution composition as set forth in claim 1.

* * * * *